(12) United States Patent
Chang

(10) Patent No.: US 6,228,703 B1
(45) Date of Patent: May 8, 2001

(54) METHOD OF FABRICATING MIXED-MODE SEMICONDUCTOR DEVICE HAVING A CAPACITOR AND A GATE

(75) Inventor: Kuang-Yeh Chang, Taipei (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/209,648

(22) Filed: Dec. 10, 1998

(51) Int. Cl.[7] .................................................. H01L 21/8242
(52) U.S. Cl. .......................... 438/241; 438/393; 438/250; 257/300
(58) Field of Search .................................. 438/383, 239, 438/241, 396, 250, 393, 397

(56) References Cited

U.S. PATENT DOCUMENTS

| 4,760,034 | * | 7/1988 | Barden | 438/251 |
| 5,173,437 | * | 12/1992 | Chi | 438/253 |
| 5,683,931 | * | 11/1997 | Takahashi | 438/253 |
| 5,804,488 | * | 9/1998 | Shih et al. | 438/396 |
| 6,033,950 | * | 3/2000 | Chen et al. | 438/239 |
| 6,080,615 | * | 6/2000 | Lee et al. | 438/239 |
| 6,146,960 | * | 11/2000 | Chang | 438/393 |

\* cited by examiner

Primary Examiner—Olik Chaudhuri
Assistant Examiner—William David Coleman

(57) ABSTRACT

A method of fabricating a mixed mode semiconductor device. A semiconductor substrate having a device isolation region and a gate oxide layer formed thereon is provided. A first conductive layer is formed to cover the device isolation region and the gate oxide layer. A dielectric layer if formed over the device isolation region to cover a part of the first conductive layer. A second conductive layer is formed on the dielectric layer and the first conductive layer. The second conductive layer and the first conductive layer are patterned to form a capacitor and a gate.

12 Claims, 5 Drawing Sheets

METHOD OF FABRICATING MIXED-MODE SEMICONDUCTOR DEVICE HAVING A CAPACITOR AND A GATE

BACKGROUND OF THE INVENTION

1. Field of the Invention

The invention relates to a method of fabricating a semiconductor device, and more particularly, to a method of fabricating a mixed-mode semiconductor device by a simplified fabrication process.

2. Description of the Related Art

In the conventional fabrication process for forming a mixed mode semiconductor device having a capacitor and a gate, the silicon substrate and the polysilicon layer are oxidized by the same thermal oxidation process to form a gate oxide layer on the substrate and an inter-poly oxide layer on the polysilicon layer, respectively. Since the silicon lattice structures of the silicon substrate and the polysilicon layer are different, a thickness ratio about 1 to 2 is resulted instead of obtaining an identical thickness of the gate oxide layer and the inter-poly oxide layer. While fabricating a capacitor, two polysilicon layers are required for forming a top and a bottom electrodes. An etching process is performed to removed a part of these two polysilicon layers. The fabrication process is lengthy and complicated, so that a great fabrication cost is caused.

FIG. 1A to FIG. 1H show a conventional fabrication process for a mix-mode semiconductor device.

In FIG. 1A, a substrate 100 having a field oxide layer 101 and a device active region 102 thereon is provided. The active region 102 is covered by an oxide layer 104. A conformal polysilicon layer 103 is formed on the oxide layer 104 and the field oxide layer 101. A photo-resist layer 105 is formed on the polysilicon layer 104 at a position predetermined for forming a capacitor in the subsequent processes.

In FIG. 1B, the polysilicon layer 104 is etched with the photo-resist layer 105 as a mask until the field oxide layer 101 is exposed, so that a bottom electrode 103a is formed.

In FIG. 1C, the oxide layer 104 is removed. Using thermal oxidation, a gate oxide layer 107 is formed on the active region 102, while an inter-poly oxide layer 106 is formed to cover the bottom electrode 103a.

In FIG. 1D, a conformal polysilicon layer 108 is formed to cover the gate oxide layer 107, the field oxide layer 101, and the inter-poly oxide layer 106.

In FIG. 1E, a conformal tungsten silicide layer 110 is formed on the polysilicon layer 108.

In FIG. 1F, a patterned photo-resist layer 112 is formed on the tungsten silicide layer 110. The areas covered by the photo-resist layer 112 are predetermined as positions for forming a gate and top electrode.

In FIG. 1G, the tungsten silicide layer 110 is etched with the photo-resist layer 112 as mask until the polysilicon layer 108 is exposed.

In FIG. 1H, the exposed polysilicon layer 108 is removed until the gate oxide layer 107, the field oxide layer 101, and the inter-poly oxide layer 106 are exposed. The photo-resist layer 112 is removed to form a gate 114 comprising a part of the tungsten silicide layer 110 and a part of the polysilicon layer 108, and a top electrode 110a comprising the other parts of the tungsten silicide layer 110 and polysilicon layer 108. A capacitor 116 is thus formed to comprise the bottom electrode 103a, the inter-poly oxide layer 106, and the top electrode 110a.

In the above method, since the silicon lattice structures of the silicon substrate and the polysilicon layer are different, a thickness ratio about 1 to 2 is resulted instead of obtaining an identical thickness of the gate oxide layer 107 and the inter-poly oxide layer 106. The thickness of the gate oxide layer 107 is thus difficult to control as required. The capacitor 116 is formed by forming and patterning two polysilicon layers, respectively. The fabrication process is lengthy and complicated, so that the fabrication cost is increased.

SUMMARY OF THE INVENTION

It is therefore an object of the invention to provide a method for fabricating a mixed-mode semiconductor device having a capacitor and a gate with a simplified fabrication process.

It is another object of the invention to provide a method for fabricating a mixed-mode semiconductor with a gate oxide layer of which the thickness can be controlled as required and the quality is enhanced.

To achieve these objects and advantages, and in accordance with the purpose of the invention, as embodied and broadly described herein, the invention is directed towards a method of fabricating a mixed-mode semiconductor device. A substrate having a gate oxide layer and an isolation region formed thereon is provided. A conformal first conductive layer is formed on the gate oxide layer and the isolation region. A conformal dielectric layer is formed on the first conductive layer. The dielectric layer is defined to form an inter-poly dielectric layer. A conformal second conductive layer is formed on the first conductive layer and the inter-poly dielectric layer. A patterned mask layer is formed on the second conductive layer. Using the mask layer as a mask, the exposed second conductive layer is etched until the underlying first conductive layer is exposed. Using the mask layer and the inter-poly dielectric layer as a mask, the exposed first conductive layer is removed. The mask layer is removed to form a gate and a capacitor.

It is to be understood that both the foregoing general description and the following detailed description are exemplary and explanatory only and are not restrictive of the invention, as claimed.

DESCRIPTION OF THE PREFERRED EMBODIMENTS

Figure 1A:
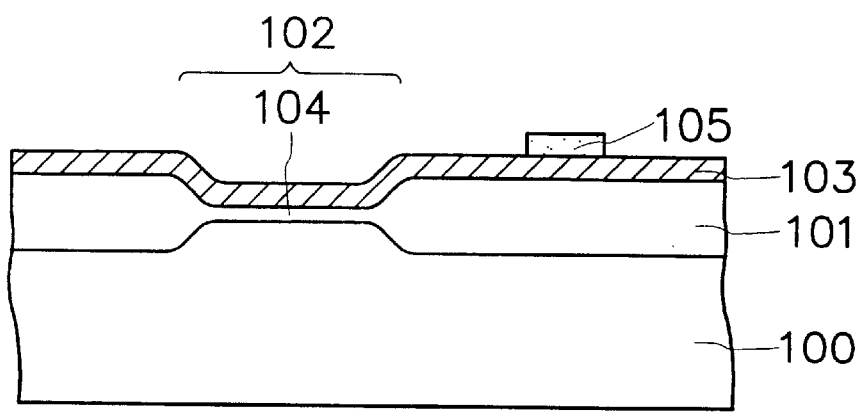
FIG. 1A to FIG. 1H are cross sectional views showing a conventional method for fabrication a mixed-mode semiconductor device having a capacitor and a gate.
Figure 1B:
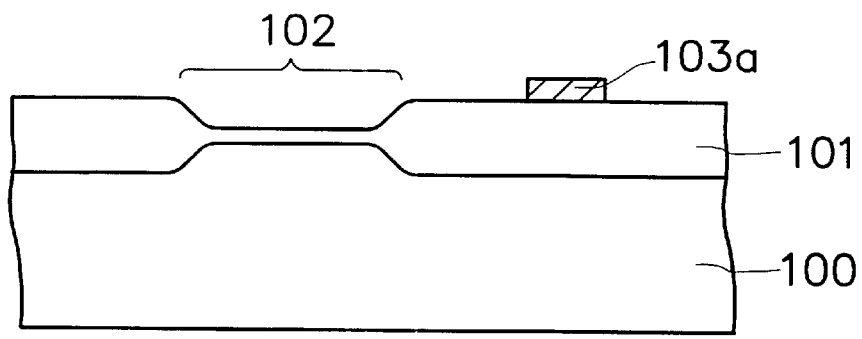
Figure 1C:
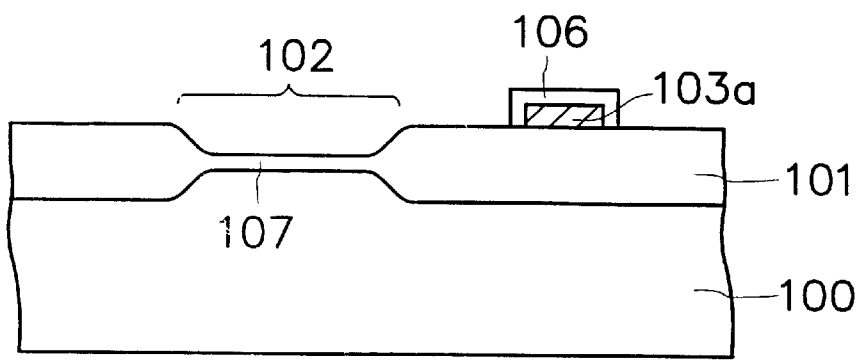
Figure 1D:
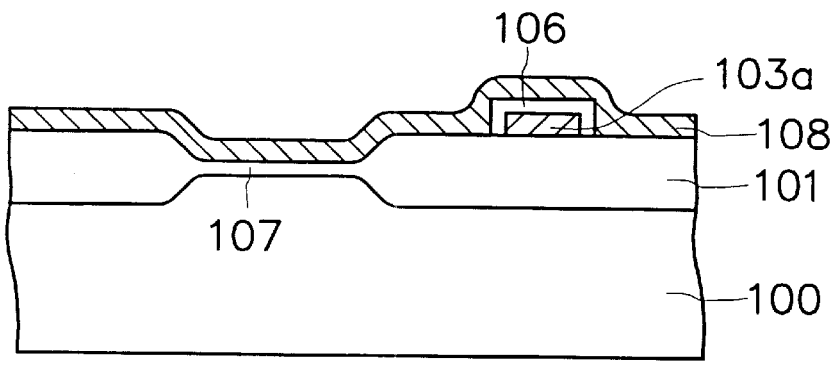
Figure 1E:
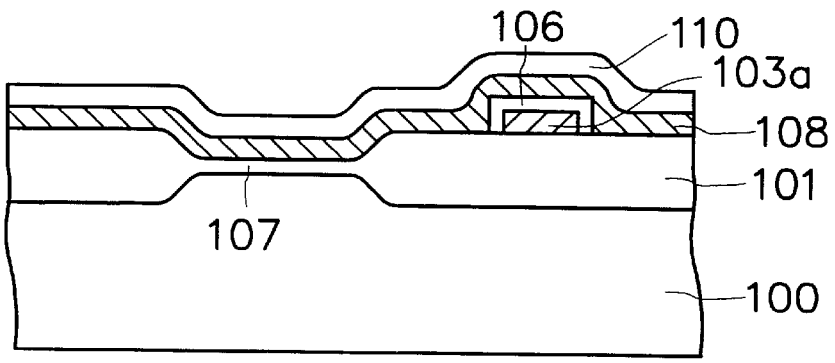
Figure 1F:
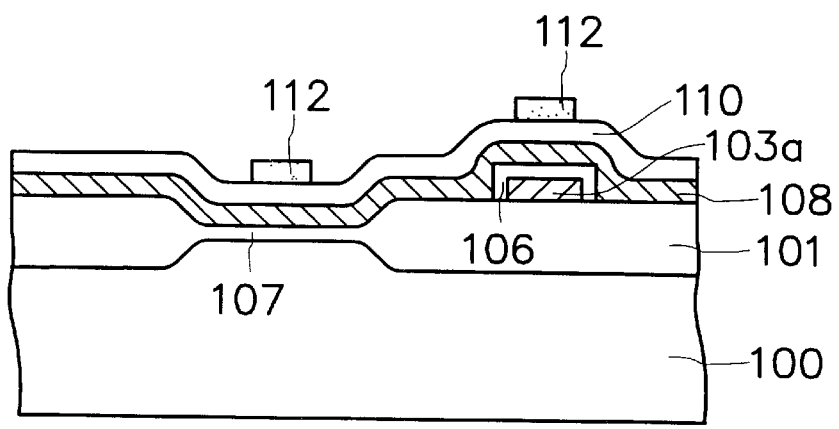
Figure 1G:
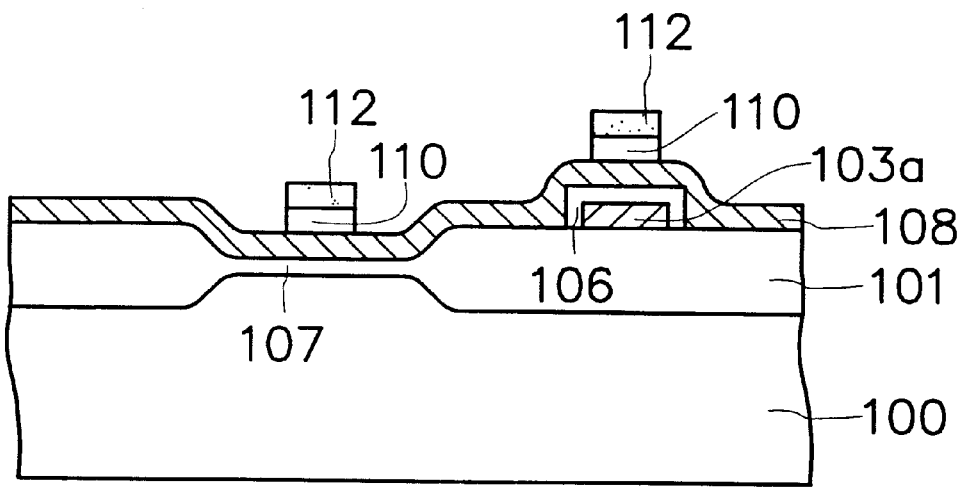
Figure 1H:
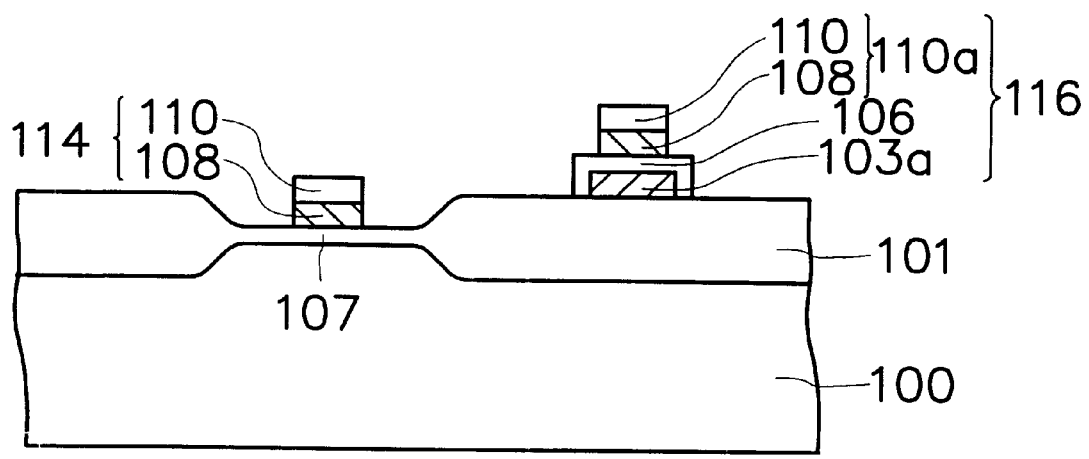
Figure 2A:
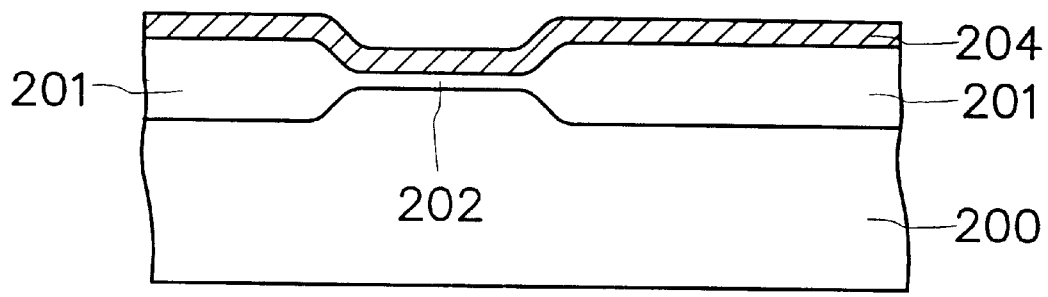
FIG. 2A and FIG. 2F are cross sectional views showing a method for fabricating a mixed-mode semiconductor device in a preferred embodiment according to the invention.

In FIG. 2A, a semiconductor substrate 200 is provided. A gate oxide layer 202 and a device isolation region 201, for example, a field oxide layer, is formed on the substrate 200. A conformal conductive layer 204, for example, a polysilicon layer formed by chemical vapor deposition (CVD), is formed on both the gate oxide layer 202 and the isolation region 201.

Figure 2B:
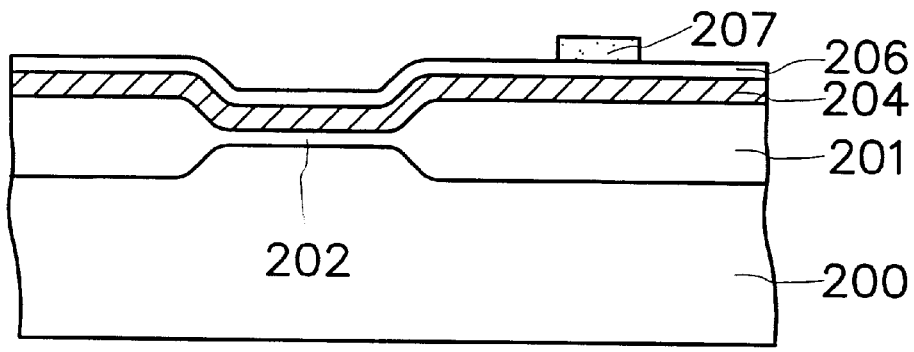

In FIG. 2B, a dielectric layer 206, for example, a silicon oxide layer or an oxide/nitride/oxide composite layer formed by thermal oxidation or chemical vapor deposition, is formed on and conformal to the conductive layer 204. A patterned mask layer 207, for example, a photo-resist layer, is formed on the dielectric layer 206.

Figure 2C:
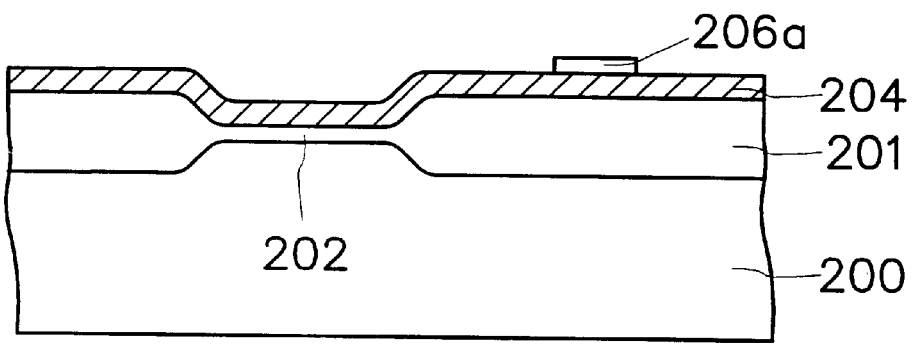

In FIG. 2C, using the mask layer 207 as an etching mask, the dielectric layer 206 is etched, for example, by anisotropic etching, until the conductive layer 204 is exposed. The mask layer 207 is removed. An inter-poly dielectric layer 206a is thus formed.

Figure 2D:
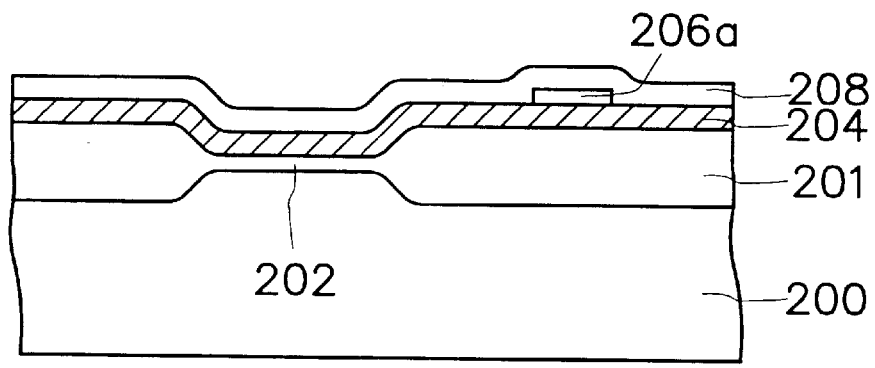

In FIG. 2D, a conformal conductive layer 208, for example, a tungsten silicide layer ($WSi_x$), a titanium silicide layer ($TiSi_x$), or a cobalt silicide layer ($CoSi_x$) formed by chemical vapor deposition, is formed on the inter-poly dielectric layer 206a and the conductive layer 204.

Figure 2E:
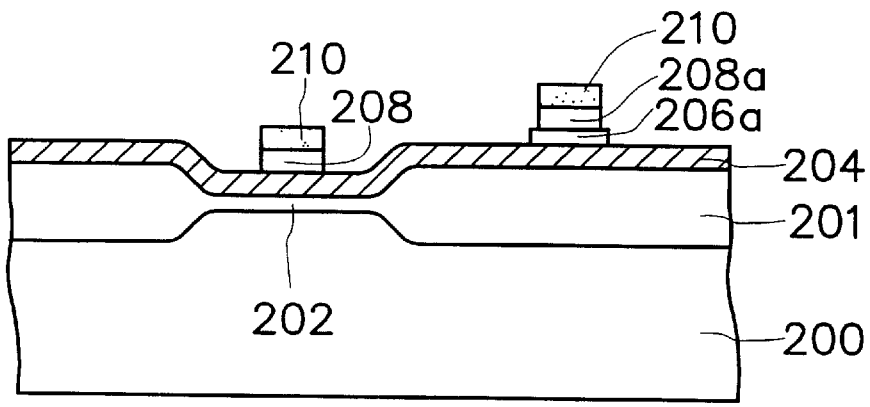

In FIG. 2E, a patterned mask layer 210, for example, a photo-resist layer, is formed on the conductive layer 208. The conductive layer 208 is etched, for example, anisotropically etched, with the mask layer 210 as an etching mask until the isolation region 210 and the gate oxide layer 202 are exposed. A top electrode 208a is thus formed by a part of the remaining conductive layer 208.

Figure 2F:
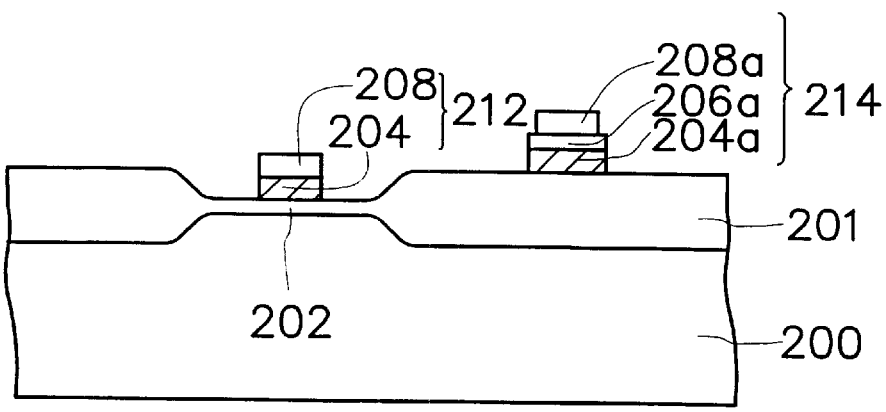

In FIG. 2F, using the mask layer 210 and the conductive layer 208 and the top electrode 208a as an etching mask, the exposed conductive layer 204 is removed to form remain two parts of the conductive layer denoted by 204 and 204a. The mask layer 210 is removed. The part of the remaining conductive layer 208 combines with the remaining conductive layer 204 to form a gate 212 over the gate oxide layer 202. A capacitor 214 is formed by the top electrode 208a, the inter-poly dielectric layer 206a, and the bottom electrode 204a on the isolation region.

In the invention (1) the fabrication process is simplified since only one polysilicon layer, that is, the conductive layer 204 is formed; (2) the gate oxide layer and the inter-poly dielectric layer are formed in different steps, so that the thickness of these two layers can be adjusted as specifically required without affecting each other; (3) since the fabrication process is simplified, the cycle time is reduced, so is the fabrication cost; (4) the capacitor is formed by three layers other than the four layers in the conventional process. A lower resistance of the capacitor thus provides a better capacitor voltage coefficient; and (5) the bottom electrode of the capacitor is formed by a self-aligned process, so that a device failure caused by misalignment is avoided.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a mixed-mode semiconductor device having a capacitor and a gate, comprising:

providing a substrate having a gate oxide layer and a device isolation region thereon;

forming a conformal first conductive layer on the gate oxide layer and the device isolation region;

forming a conformal dielectric layer on the first conductive layer;

patterning the dielectric layer to form an inter-poly dielectric layer covering a portion of the first conductive layer;

forming a second conductive layer on the first conductive layer and the inter-poly dielectric layer;

patterning the second conductive layer to leave a part of the second conductive layer over the gate oxide layer and to leave a top electrode on the inter-dielectric layer until the first conductive layer is exposed; and removing the exposed first conductive layer until the gate oxide layer and the device isolation region are exposed.

2. The method according to claim 1, wherein the first conductive layer includes a polysilicon layer.

3. The method according to claim 1, wherein the second conductive layer is formed from a material selected from one of tungsten silicide, titanium silicide, and cobalt silicide.

4. The method according to claim 1, wherein the device isolation region includes a field oxide layer.

5. The method according to claim 1, wherein the inter-poly dielectric layer includes a silicon oxide layer.

6. The method according to claim 1, wherein the inter-poly dielectric layer includes an oxide/nitride/oxide composite layer.

7. A method of fabricating a mixed-mode semiconductor device having a capacitor and a gate, comprising:

providing a substrate with a device isolation region;

forming a gate oxide layer on the substrate;

forming a first conductive layer on the gate oxide layer and the device isolation region;

forming a dielectric layer covering a part of the first conductive layer on the device isolation region;

forming a second conductive layer to cover the first conductive layer and the dielectric layer;

patterning the second conductive layer to leave a part of the second conductive layer over the gate oxide layer and to leave a top electrode on the inter-dielectric layer until the first conductive layer is exposed; and removing the exposed first conductive layer until the gate oxide layer and the device isolation region are exposed.

8. The method according to claim 7, wherein the first conductive layer includes a polysilicon layer.

9. The method according to claim 7, wherein the second conductive layer formed from a material selected from one of tungsten silicide, titanium silicide, and cobalt silicide.

10. The method according to claim 7, wherein the device isolation region includes a field oxide layer.

11. The method according to claim 7, wherein the inter-poly dielectric layer includes a silicon oxide layer.

12. The method according to claim 7, wherein the inter-poly dielectric layer includes an oxide/nitride/oxide composite layer.

* * * * *